(12) United States Patent
Sugawara et al.

(10) Patent No.: US 8,021,987 B2
(45) Date of Patent: Sep. 20, 2011

(54) METHOD OF MODIFYING INSULATING FILM

(75) Inventors: Takuya Sugawara, Santa Clara, CA (US); Yoshihide Tada, Nirasaki (JP); Genji Nakamura, Nirasaki (JP); Shigenori Ozaki, Amagasaki (JP); Toshio Nakanishi, Amagasaki (JP); Masaru Sasaki, Amagasaki (JP); Seiji Matsuyama, Amagasaki (JP); Kazuhide Hasebe, Nirasaki (JP); Shigeru Nakajima, Nirasaki (JP); Tomonori Fujiwara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/632,131

(22) Filed: Dec. 7, 2009

(65) Prior Publication Data

US 2010/0105215 A1 Apr. 29, 2010

Related U.S. Application Data

(60) Division of application No. 11/289,330, filed on Nov. 30, 2005, now Pat. No. 7,655,574, which is a continuation-in-part of application No. PCT/JP2004/007841, filed on May 28, 2004.

(30) Foreign Application Priority Data

May 30, 2003 (JP) ................................ 2003-154812

(51) Int. Cl.
*H01L 21/38* (2006.01)
*H01L 21/469* (2006.01)

(52) U.S. Cl. ......... 438/758; 438/795; 438/770; 438/776

(58) Field of Classification Search .................. 438/758, 438/287, 770, 776, 772, 771, 591, 183, 775, 438/765, 769, 795
See application file for complete search history.

(56) References Cited

U.S. PATENT DOCUMENTS

| 6,287,988 | B1 | 9/2001 | Nagamine et al. |
| 6,348,373 | B1 | 2/2002 | Ma et al. |
| 6,897,149 | B2 | 5/2005 | Sugawara et al. |
| 7,211,497 | B2 | 5/2007 | Hiraiwa et al. |
| 7,226,874 | B2 * | 6/2007 | Matsuyama et al. .......... 438/786 |
| 7,250,375 | B2 | 7/2007 | Nakanishi et al. |
| 2001/0055821 | A1 | 12/2001 | Hosoda et al. |
| 2002/0002948 | A1 | 1/2002 | Hongo et al. |
| 2005/0176223 | A1 | 8/2005 | Matsuyama et al. |

FOREIGN PATENT DOCUMENTS

| JP | 2000-077672 | 3/2000 |
| JP | 2001-313292 | 11/2001 |
| JP | 2002-26273 | 1/2002 |
| JP | 2002-50622 | 2/2002 |
| JP | 2002-64144 | 2/2002 |
| JP | 2002-329721 | 11/2002 |
| JP | 2004-22902 | 1/2004 |
| JP | 2004-79931 | 3/2004 |
| WO | 02/059956 A1 | 8/2002 |
| WO | WO 03/015151 A1 | 2/2003 |

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

An insulting film is modified by subjecting the insulting film to a modification treatment comprising a combination of a plasma treatment and a thermal annealing treatment. There is provided a method of enhancing the characteristic of an insulating film by improving deterioration in the characteristic of the insulating film due to carbon, a suboxide, a dangling bond or the like contained in the insulating film.

24 Claims, 5 Drawing Sheets

Jg-Eox

Fig.5

Fig.6 ially based on the high dielectric constant is used, there may arise a problem that the leakage current slightly increases as compared with the conventional silicon oxide film (SiO$_2$). [Omitted — page continues...]

METHOD OF MODIFYING INSULATING FILM

This is a continuation-in-part of International Application No. PCT/JP2004/007841, filed on May 28, 2004 This application is a DIV. of Ser. No. 11/289,330 Nov. 30, 2005 now U.S. Pat. No. 7,655,574.

TECHNICAL FIELD

The present invention relates to a method of modifying an insulating film. More specifically, the present invention relates to a method of enhancing the insulating film modification effect by combining a step of irradiating an insulating film formed by CVD (chemical vapor deposition) or the like with a plasma based on a rare gas-containing process gas, and a step of thermally annealing the insulating film at a high temperature of preferably from 500 to 1,200° C., more preferably from 600 to 1,050° C. The modification method of the present invention can be suitably used particularly when the film obtained by this modification is used for a gate insulating film of a so-called MOSFET (metal-oxide-semiconductor field effect transistor) or for an interelectrode insulating film of a capacitor in a memory device.

BACKGROUND ART

The present invention may be widely applicable to the production in general of an electronic device material in a semiconductor apparatus (semiconductor device), a liquid crystal apparatus (liquid crystal device) and the like, but for the sake of convenience, the present invention is described here by referring to, for example, the technique of forming a gate insulating film of a MOSFET in a semiconductor apparatus and the background art thereof.

The substrate for a semiconductor or electronic device material including silicon is subjected to various processings such as formation of an insulating film including an oxide film, film-formation by CVD or the like, and etching.

It is not an exaggeration to say that high-performance fabrication of a semiconductor device in recent years has been developed on the miniaturization technique of the device including a MOSFET. Still at present, improvement of the miniaturization technique of a MOSFET is being made with an attempt to achieve higher performance. To cope with recent demands for miniaturization and high performance of a semiconductor device, needs for an insulating film having higher performance (for example, in view of leakage current) are keenly increasing. This is because even a leakage current on a level of causing no actual problem in a conventional device having a relatively low integration degree has a possibility of consuming a large quantity of electric power in a recent miniaturized and/or high-performance device. Particularly, a low power consumption device is essential for the development of a portable electronic device in a recently started so-called ubiquitous society (information society allowing for connection to the network at any time and any place through an electronic device as the medium), and reduction of the leakage current is a very important problem.

Typically, for example, in developing a next-generation MOSFET, thinning of a gate insulating film is approaching the limit with the progress of the above-described miniaturization technique and a large problem to be solved comes out. That is, as for the process technique, the silicon oxide film (SiO$_2$) used as a gate insulating film at present can be thinned to the extreme (on a level of one- or two-atom layer), but when the film is thinned to a thickness of 2 nm or less, there arises a problem that an exponential functional increase of leakage current is generated by the direct tunnel due to a quantum effect and the power consumption increases.

At present, the IT (information technology) market is changing from a fixed electronic device (a device to which an electric power is supplied from a wall socket) as represented by a desktop-type personal computer, a home telephone and the like to a "ubiquitous network society" allowing for connection, for example, to the network at any time and any place. Accordingly, it is considered that a mobile terminal such as cellular phone and car navigation system becomes mainstream in the near future. Such a mobile terminal is required to be a high-performance device in itself but at the same time, must be promised to have a function capable of standing long use even when driven by a small and light-weight battery, electric cell or the like which is not so much required in the fixed device. In this way, reduction in the power consumption while achieving such a high performance is very important for the mobile terminal.

Typically, when miniaturization of a high-performance silicon LSI is sought for in the process of developing, for example, a next-generation MOSFET, there arises a problem that the leakage current increases and in turn, power consumption increases. For decreasing the power consumption while seeking for the performance, it is necessary to enhance the characteristic without increasing the gate leakage current in a MOSFET.

In order to satisfy such a requirement for the realization of a high-performance MOSFET with low power consumption, various techniques (for example, use of silicon oxide nitride film (SiON) as the gate insulating film) have been proposed and one useful technique is the development of a gate insulating film using a high-k (high dielectric constant) material, that is, a material having a dielectric constant higher than that of SiO$_2$. By using such a high-k material, the EOT (equivalent oxide thickness) which is a film thickness in terms of SiO$_2$ can be made smaller than the physical film thickness. In other words, a film having a physically large thickness with the same EOT as SiO$_2$ can be used and great reduction of the power consumption can be expected. At present, HfO$_2$, Al$_2$O$_3$, Ta$_2$O$_5$, ZrO$_2$ and the like which are a material having a dielectric constant higher than that of SiO$_2$ come up for such a high-k material.

(Non-Patent Document 1)
M. A. Cameron and S. M. George, *Thin Solid Films*, 348 (1999), pp. 90-98, "ZrO$_2$ film growth by chemical vapor deposition using zirconium tetra-tert-butoxide"

(Non-Patent Document 2)
Sadayoshi Horii, Masayuki Asai, Hironobu Miya, Kazuhiko Yamamoto and Masaaki Niwa, *Extended Abstracts of the SSDM, Nagoya,* 2002, pp. 172-173, "Improvement of Electrical Characteristic for High-k Dielectrics Grown by MOCVD via Cyclic Remote Plasma Oxidation"

(Non-Patent Document 3)
Katsuyuki Sekine, Yuji Saito, Masaki Hirayama and Tadahiro Ohmi, *J. Vac. Sci. Technol. A* 17(5), September/October 1999, pp. 3129-3133, "Silicon nitride film growth for advanced gate dielectric at low temperature employing high-density and low-energy ion bombardment"

(Non-Patent Document 4)
Takuya Sugawara, Toshio Nakanishi, Masaru Sasaki, Shigenori Ozaki and Yoshihide Tada, *Extended Abstracts of Solid State Devices and Materials,* 2002, pp. 714-715, "Characterization of Ultra Thin Oxynitride Formed by Radical Nitridation with Slot Plane Antenna Plasma"

However, in the case where an insulating film using a high-k material expected to ensure such excellent characteristic is formed in practice by a CVD method (chemical vapor deposition) or the like, the film formation is performed at a low temperature so as to enhance the in-plane uniformity and therefore, the obtained film allows for the presence of a large number of non-bonded bonds (dangling bond), weak Si—O bonds (suboxide), carbons contained in the raw material for film formation, or the like and can hardly have good characteristic (Reference Document [1]). Accordingly, it is very important for practically using a high-k material film to eliminate these causes giving rise to deterioration of the film quality. As for the means to solve this problem, an attempt of applying a modification treatment by thermal annealing to the insulating film, thereby improving the film characteristic, is being made (Reference Document [1]). However, the modification treatment by thermal annealing is associated with a problem such as deterioration of the characteristic resulting from crystallization of the insulating film due to a high-temperature process, or increase in the electrical film thickness (lowering of effective dielectric constant) due to oxidation of silicon at the insulating film-silicon interface.

As for the method of solving these associated problems in the modification treatment by thermal annealing, a modification treatment of an insulating film by a plasma capable of effecting a modification treatment at a substrate temperature of about 400° C. has been proposed (Reference Document [2]). By use of this modification treatment of an insulting film by a plasma, the weak bond of a suboxide may be repaired at a low temperature to form a strong Si—O bond, or carbon in the film may be burned, so that good electrical characteristic can be obtained. However, the plasma forming method reported at present has a problem such as plasma damage due to high electron temperature or difficulty in large-area formation (Non-Patent Documents 1 and 2).

In order to solve such a problem, a plasma forming method using a plane antenna and microwave has been recently proposed as a plasma treating method for the formation of a gate insulating film. This is a method where a rare gas such as He, Ne, Ar, Kr and Xe is supplied together with an oxygen- or nitrogen-containing gas from a ring-like shower plate provided above a substrate to be treated to a space between the plate to be treated and the shower plate, and microwave is irradiated from the behind of a plane antenna having a slot (slot plane antenna (SPA)) provided above the shower plate, whereby microwave is introduced through the antenna and the rare gas is plasma-excited by using the microwave in the space. A technique of forming an oxygen radical* or a nitrogen radical N* by using this plasma, and oxidizing or nitriding the surface of a silicon substrate has been proposed. The plasma formed by this method has a high electron density and therefore, a radical is produced in a large amount even at a low substrate processing temperature. Also, the electron temperature is low and therefore, the plasma damage brought about as a problem in other plasma forming methods is low. Furthermore, it is reported that since microwave propagated through a plane antenna uniformly forms a plasma in a large area, an excellent effect is provided also in view of application to a large-area substrate such as 300-mm wafer or substrate for a large TFT display device (Non-Patent Documents 3 and 4).

By using such a technique, a radical can be formed in a large amount even when the surface of an electronic device substrate is at a low substrate temperature of 400° C. or less. Other than the application to formation of an oxide film or oxynitride film, this technique is promising also for use in the modification treatment of an insulating film. In practice, studies related to the modification of an insulating film by using this plasma are being made, but a sufficiently high modification effect is not yet attained only by modification using the plasma.

DISCLOSURE OF THE INVENTION

A general purpose of the present invention is to provide a novel and useful method of modifying an insulating film, which has solved the above-described problem encountered in the prior art.

Means for Solving the Problem

The present invention provides a substrate processing method for modifying an insulating film formed on the surface of a substrate for an electronic device, the method comprising a combination of a step of irradiating the insulating film with a plasma based on a rare gas-containing process gas, and a step of subjecting the insulating film to thermal annealing.

According to the present invention, for example, in a method of modifying a gate insulating film of a MOSFET or an interelectrode insulating film of a capacitor used in a memory device, a modification method using a plasma treatment and a modification method using a thermal annealing treatment are combined, whereby the modification effect which has been insufficient only by the modification using a plasma treatment or only by the modification using a thermal annealing treatment can be enhanced.

According to the present invention, for example, a modification treatment by a plasma treatment and a modification treatment by a thermal annealing treatment are combined, whereby the treatment time in each modification treatment step can be shortened and deterioration in the characteristic of the insulating film, which is caused during a long-time plasma treatment or a long-time thermal annealing treatment, can be suppressed.

According to the present invention, for example, a step of plasma-treating an insulating film by using a plasma based on a process gas containing a rare gas and oxygen atom for the purpose of removing carbon in the insulating film, and a step of thermally annealing the insulating film in a nitrogen atom-containing gas atmosphere for the purpose of modifying a weak bond such as suboxide or dangling bond in the film to a strong bond by the relaxing effect of heat and suppressing bleed-out of boron from a gate electrode in a P-type MOSFET, can be combined.

According to the present invention, for example, a step of plasma-treating an insulating film by using a plasma based on a process gas containing nitrogen atom and a rare gas for the purpose of suppressing crystallization of the insulating film caused due to a thermal annealing treatment and suppressing bleed-out of boron from a gate electrode in a P-type MOSFET, and a step of thermally annealing the insulating film in an oxygen atom-containing gas atmosphere for the purpose of modifying a weak bond such as suboxide or dangling bond in the film to a strong bond by the relaxing effect of heat, can be combined.

According to the present invention, for example, in a step of performing modification by irradiating the surface of an insulating film with a plasma based on a rare gas-containing process gas, a plasma formed by supplying microwave to a plane antenna can be used as the plasma.

In addition, the present invention provides a program which causes a computer to function as a controller for conducting the above-mentioned method of modifying an insulating film or a method of processing a substrate, and is capable of running in association with a computer.

The present invention also provides a program which causes a computer to conduct at least one step of the above-mentioned method of modifying an insulating film, or a method of processing a substrate, and is capable of running in association with a computer.

The present invention further provides a computer-readable medium, which stores a program which causes a computer to function as a controller for conducting the above-mentioned method of modifying an insulating film, or a method of processing a substrate, or a program which causes a computer to conduct at least one step of the above-mentioned method of modifying an insulating film, or a method of processing a substrate. The program which has been read from the computer-readable medium can perform the above-mentioned function in association with a computer.

Further, the constitution of the present invention may be accomplished by using a hardware or a software, or an appropriate combination of a hardware or a software.

BEST MODE FOR CARRYING OUT THE INVENTION

The present invention is described in detail below by referring to the drawings as desired.

Figure 1:
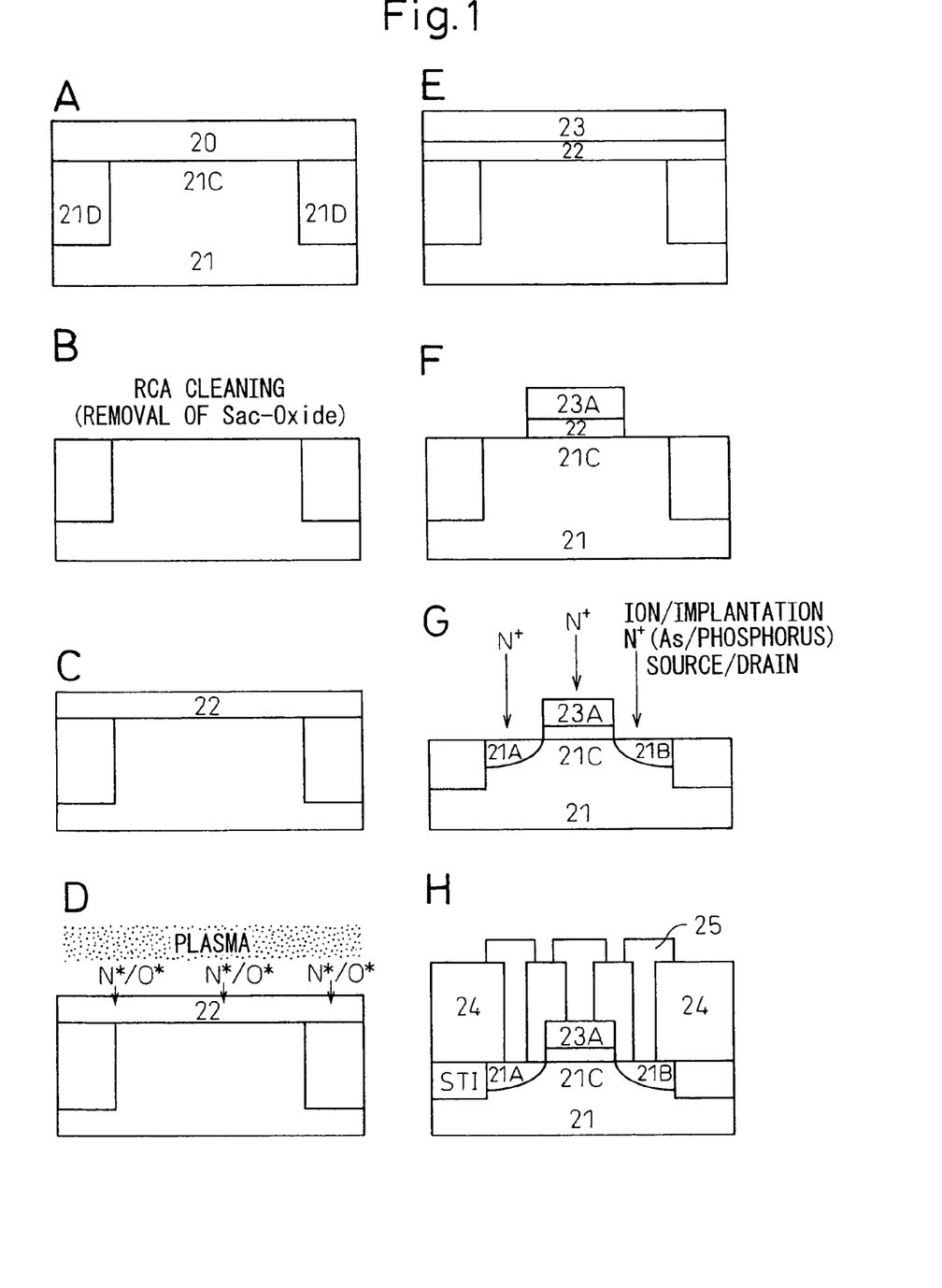
FIGS. 1A to 1H show a production process of an N-type MOSFET as a representative application example of the method of the present invention.
Figure 2:
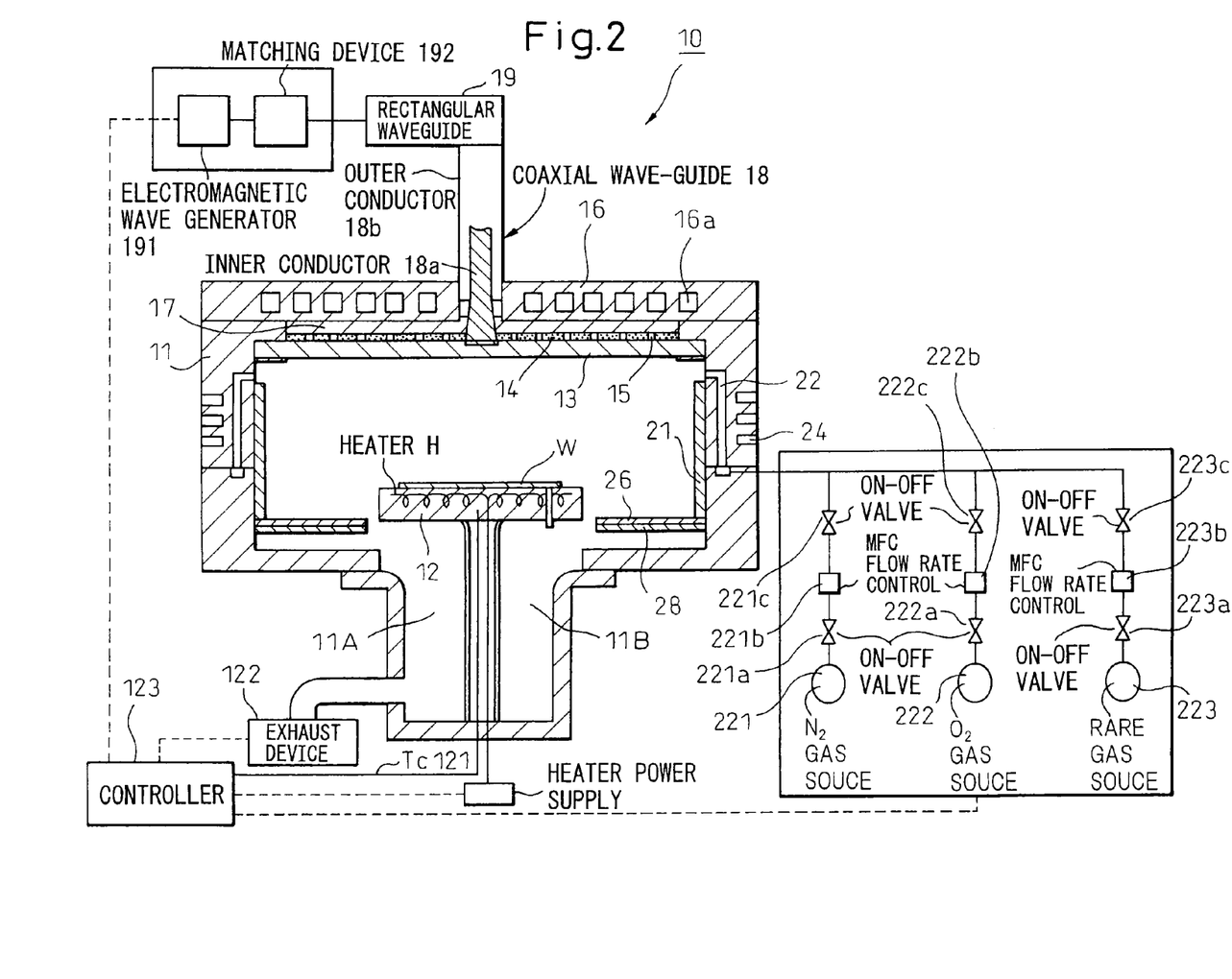
FIG. 2 is a schematic cross-sectional view in the vertical direction showing one example of a plasma-forming apparatus using microwave and a plane antenna having a slot (slot plane antenna (SPA)).
Figure 3:
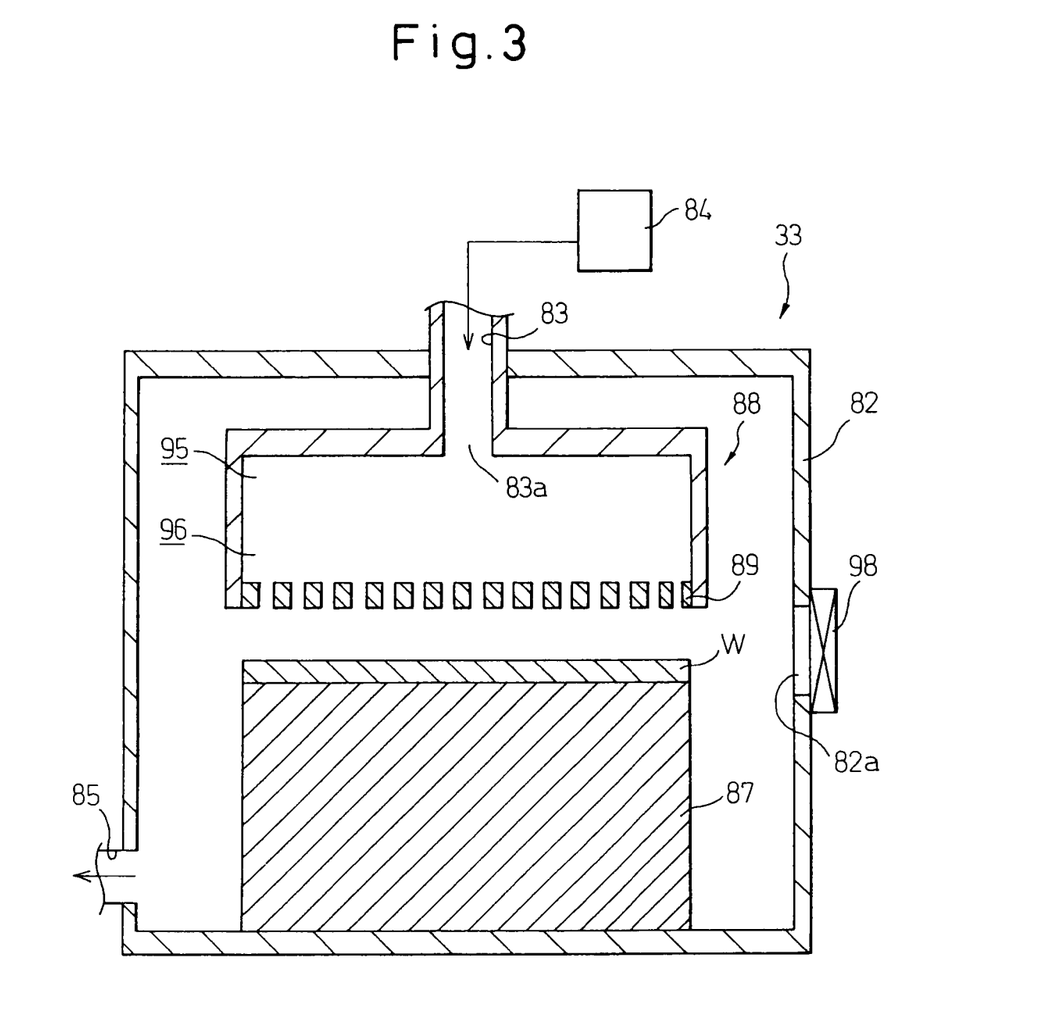
FIG. 3 is a schematic cross-sectional view in the vertical direction showing one example of a heat treatment unit 33 usable for a thermal annealing treatment.

FIGS. 1A to 1H show a production process of an N-type MOSFET as a representative application example of the method of the present invention, and FIG. 2 is a schematic cross-sectional view in the vertical direction showing one example of the above-described plasma-forming apparatus 32 using microwave and a plane antenna. FIG. 3 is a schematic cross-sectional view in the vertical direction showing one example of a heat treatment unit 33 usable for thermal annealing.

(Application to Production of N-Type MOSFET)

FIG. 1 shows a production process of an N-type MOSFET as a representative application example of the method of the present invention. Referring to FIGS. 1A to 1H, in the step of FIG. 1A, a P-type silicone substrate 21 having a resistivity of 1 to 30 Ωcm and a plate orientation (100) is used as the substrate. A channel 21C implant by a device separation step 21D (e.g., STI, LOCOS) or the implantation of boron (B) is applied to the silicone substrate, and a sacrificing oxide film 20 is formed on the silicon substrate surface where a gate insulating film 22 is formed.

In the step of FIG. 1B, cleaning before formation of the gate insulating film is performed. In general, the sacrificing oxide film 20 and a contamination factor (e.g., metal, organic material, particle) may be removed by RCA cleaning using a combination of APM (a mixed solution of ammonia, hydrogen peroxide solution and pure water), HPM (a mixed solution of hydrochloric acid, hydrogen peroxide solution and pure water) and DHF (a mixed solution of hydrofluoric acid and pure water). If desired, SPM (a mixed solution of sulfuric acid and hydrogen peroxide solution), an aqueous ozone, FPM (a mixed solution of hydrofluoric acid, hydrogen peroxide solution and pure water), an aqueous hydrochloric acid (a mixed solution of hydrochloric acid and pure water), an organic alkali or the like is also sometimes used.

In the step of FIG. 1C, a gate insulating film 22 is formed. The material constituting the insulating film usable in the present invention is not particularly limited and a film formed by a known vapor deposition method such as CVD (chemical vapor deposition) and PVD (physical vapor deposition) can be used without any particular limitation as long as it is an insulating film based on vapor deposition. More specific examples of the insulating film forming method which may be preferably used include a thermal CVD method utilizing a radical forming reaction by heat, a plasma CVD method using a radical forming reaction by a plasma, a hot wire CVD method utilizing a catalytic reaction, and a PVD method as represented by a technique such as electron beam vapor deposition and sputtering. Examples of the insulating film material which may be preferably used include a low-dielectric material (e.g., $SiO_2$, SiON, $Si_3N_4$), a high-k material (e.g., $Ta_2O_5$, $ZrO_2$, $HfO_2$, $Al_2O_3$, $La_2O_3$, $TiO_2$, $Y_2O_3$, SBT, BST, $Pr_2O_3$, $PZTGd_2O_3$, $CeO_2$, silicates such as HfSiO, ZrSio, and aluminates such as ZrAlO) and at least one compound of such a substance.

In the step of FIG. 1D, the gate insulating film 22 is subjected to a modification treatment. The modification treatment is performed by combining a modification treatment by a plasma formed by use of microwave and a plane antenna, and a modification treatment by thermal annealing. The plasma treatment and the thermal annealing treatment may be arbitrarily combined and, for example, various combinations of steps described below may be considered.

(1) Formation of gate insulating film→plasma oxidation treatment→thermal nitridation annealing treatment;

(2) Formation of gate insulating film→plasma nitridation treatment→thermal oxidation annealing treatment;

(3) Formation of gate insulating film→thermal oxidation annealing treatment→plasma nitridation treatment;

(4) Formation of gate insulating film→thermal nitridation annealing treatment→plasma oxidation treatment;

(5) Formation of gate insulating film→plasma nitridation treatment→thermal nitridation annealing treatment→plasma oxidation treatment;

(6) Formation of gate insulating film→thermal oxidation annealing treatment→plasma nitridation treatment→plasma oxidation treatment;

(7) Formation of gate insulating film→plasma oxidation treatment→plasma nitridation treatment→thermal oxidation annealing treatment;

(8) Formation of gate insulating film→plasma oxidation treatment→plasma nitridation treatment→thermal nitridation annealing treatment;

(9) Formation of gate insulating film→plasma nitridation treatment→plasma oxidation treatment→thermal nitridation treatment.

By arbitrarily combining steps of these plasma treatments and thermal annealing treatments, an insulating film having suitable characteristic can be formed.

In the step of FIG. 1E, a polysilicon 23 for a gate electrode is film-formed. On the gate insulating film 22 formed in FIG. 1C, a polysilicon 23 is film-formed as a gate electrode of a MOSFET by the CVD method. The silicon substrate having formed thereon the gate insulating film is heated at 620° C. and a silane gas is introduced on the substrate under a pressure of 30 Pa, whereby a polysilicon 23 for the electrode is film-formed to a thickness of 150 nm on the gate insulating film.

Thereafter, resist patterning and selective etching of the gate electrode 23A are performed to form an MOS capacitor (FIG. 1F), and source and drain implants are applied to form a source 21A and a drain 21B (FIG. 1G). Subsequently, annealing is performed to activate the dopant (for example, boron (B), phosphorus (P) or arsenic (As) implanted in the channel, gate, source or drain). Furthermore, a post-step is performed by combining formation of an interlayer insulating film 24 comprising a low dielectric substance such as TEOS, patterning, selective etching and film formation of metal wiring 25. In this way, an MOSFET according to this embodiment is obtained (FIG. 1H).

(Modification Treatment Method by Plasma)

The modification treatment method by a plasma, using microwave and a plane antenna, is described in detail below.

FIG. 2 is a schematic cross-sectional view in the vertical direction of the above-described plasma-forming apparatus using microwave and a plane antenna.

Referring to FIG. 2, the plasma substrate-processing apparatus 10 in this embodiment comprises a processing container 11 equipped with a substrate-holding table 12 for holding a substrate W (for example, silicon wafer) to be treated. The gas in the processing container 11 is exhausted from exhaust ports 11A and 11B through an exhaust pump (not shown). The substrate-holding table 12 has a heater function of heating the substrate W to be treated. From the standpoint of forming a uniform gas flow, a gas baffle plate (division plate) 26 comprising aluminum is disposed in the periphery of the substrate-holding table 12. On the top surface of the gas baffle plate 26, a quartz cover 28 is provided so as to prevent metal contamination.

In the upper portion of the processing container 11 of the apparatus, an opening is provided correspondingly to the substrate W to be treated on the substrate-holding table 12. This opening is air-tightly closed with a dielectric plate 13 comprising quartz, $Al_2O_3$ or the like. On the top of the dielectric plate 13 (on the outer side of the processing container 11), a plane antenna 14 is disposed. Further, a wavelength-shortening plate 17 and a coaxial wave-guide tube 18 are disposed so as to cover the upper portion (on the outer side) of the plane antenna 14. In this plane antenna 14, a plurality of slots for transmitting electromagnetic wave supplied from the coaxial wave-guide tube 18 are formed. In the outside of the processing container 11, a cooling plate 16 is disposed to cover the top of the wavelength-shortening plate 17. In the inside of the cooling plate 16, a refrigerant path 16a allowing for flowing of a refrigerant is provided, so as to prevent the thermal breakage of the plane antenna 14, dielectric plate 13, wavelength-shortening plate 17, etc., and to generate a stable plasma.

In the plasma substrate-processing apparatus 10 of this embodiment, electromagnetic wave generator 191 for generating electromagnetic wave of several giga-hertz for exciting a plasma is provided. The wave-guide tube 18 has an inner conductor 18a and an outer conductor 18b. Microwave generated in this electromagnetic wave generator 191 is propagated through the matching device 192, coaxial wave-guide tube 19, and wave-guide tube 18, and further via the dielectric plate 13, introduced into the processing container 11.

In the case of using a plasma processing apparatus 10 of the embodiment shown in FIG. 2, for example, a substrate W to be treated is set in the processing container 11 of the plasma processing apparatus 10 and then, air inside the processing container 11 is evacuated through exhaust ports 11A and 11B, whereby the inside of the processing container 11 is set to a predetermined treatment pressure. Thereafter, a predetermined gas (for example, an inert gas and a process gas) is supplied from a gas supply port 22.

A nitrogen gas supply source 221, an oxygen-nitrogen gas supply source 222 and a rare gas supply source 223 are connected to the gas supply port 22 through tubes. As show in FIG. 2, each of the supply sources is provided with an internal supply valve 221a, 222a and 223a, a flow rate controller (Mass Flow Controller; MFC) 221b, 222b and 223b, and an external supply valve 221c, 222c and 223c, respectively. The flow rate of each of the gases supplied from the gas supply port 22 is controlled by the flow rate controller 221b, 222b and 223b and is supplied into the processing container.

A thermo couple (TC) 121 is disposed in the substrate-holding table 12. The temperature of the substrate-holding table 12 is monitored and fed back to the electrical power source of a heater so as to control the temperature of a pedestal and to heat the substrate.

On-off and output control of the electromagnetic wave generator 191, the flow rate adjustment by the flow rate controllers 221b, 222b and 223b, the exhaust amount adjustment by an exhaust device 122, and a heater H of the substrate-holding table 12, etc., are controlled by a controller 123, and the plasma processing apparatus 10 is controlled so as to carry out an optimum processing.

On the other hand, the microwave at a frequency of several GHz generated in the electromagnetic wave generator 191 is supplied to the processing container 11 by passing through the matching device 192, rectangular wave-guide tube 19, coaxial wave-guide tube 19, and wavelength-shortening plate 17, and further via the plane antenna 14 and dielectric plate 13, and the microwave is introduced into the processing container 11. As a result, a plasma is excited by the microwave. At this time, since the microwave is introduced through the antenna, a high-density plasma of $10^{11}$-$10^{13}$/cm$^3$, at a low electron temperature of 0.7-2 eV is generated and also, a uniform plasma distribution is obtained in a wide region proportional to the antenna area. Accordingly, when the substrate-processing apparatus of FIG. 2 is used, a large-area substrate such as 300-mm wafer or substrate for a large TFT display device can be treated and at the same time, by virtue of a low electron temperature of the plasma, the plasma modification treatment can be performed without causing a plasma damage giving rise to deterioration in the characteristic of the semiconductor device.

At the operation, the gas inside the processing container 50 is exhausted outside the vacuum pump 55 through an exhaust tube 53 and therefore, the inside is set to a predetermined treatment pressure.

A radical formed by the plasma flows toward the diameter direction along the surface of the substrate W to be treated and is swiftly discharged into the exhaust ports 11A and 11B and therefore, recombination of a radical is suppressed, so that the substrate can be efficiently and very uniformly treated.

The modification treatment method by a plasma is roughly classified into two cases, that is, a case where an oxygen plasma comprising a gas containing oxygen atom and a rare gas is used, and a case where a nitrogen plasma comprising a gas containing nitrogen atom and a rare gas is used.

In the case of using a gas containing oxygen atom and a rare gas, an oxygen radical is generated in a large amount and an oxidation reaction occurs. Accordingly, when a plasma oxidation treatment is applied to an insulating film formed by CVD using an organic metal source as the raw material, an effect of burning by oxidation an organic material (carbon atom) in the film so as to remove the organic material, which is contained in a large amount in the insulating film, and enhancing the film quality is expected. Also, a suboxide weak bond present in the film is repaired by oxidation and this is expected to bring about densification of the film structure and enhancement of the characteristic. However, the structural relaxation in the film does not proceed only by the plasma oxidation treatment performed at a low temperature, and a dangling bond in the film cannot be completely repaired. Furthermore, a boron penetration effect in a P-type MOSFET cannot be suppressed. Therefore, modification by a nitridation treatment is necessary. In this nitridation treatment, when modification is performed by a plasma nitridation treatment, the effect of preventing boron penetration may be achieved but since the plasma nitridation treatment is performed at a low temperature, satisfactory structural relaxation of the film is not obtained. Therefore, a modification treatment by thermal nitridation annealing becomes necessary. By performing in this way an oxidation treatment by plasma oxidation at a low substrate treatment temperature in combination with a thermal nitridation annealing treatment, a sufficiently high modification effect can be obtained.

In the case of using a gas containing nitrogen atom and a rare gas, a nitrogen radical is generated in a large amount and a nitridation reaction occurs. The dielectric constant of the film increases by virtue of nitrogen atom contained in the insulating film and therefore, this treatment can be suitably applied to a gate insulating film or the like of a MOSFET. Also, the oxidation resistance of an insulating film subjected to nitridation is enhanced, so that oxidation on the interface at the annealing for activating a dopant can be suppressed and increase in the electrical film thickness (i.e., EOT; the value which has been obtained by converting the physical thickness of a high-k film into an electrical film thickness of an $SiO_2$ film which is equivalent to the high-k film) can be reduced. Furthermore, when an interelectrode insulating film of a capacitor is subjected to nitridation and a metal electrode is formed thereon, oxidation of the upper metal electrode is suppressed and a problem such as peeling of the electrode can be avoided. In addition, by performing nitridation, the boron penetration-preventing effect (i.e., the effect of blocking the penetration of a dopant in an electrode) in a P-type MOSFET is enhanced, so that deterioration of characteristic in a P-type MOSFET, such as fluctuation of the threshold voltage, can be suppressed. However, carbon contained in the film cannot be removed by burning only by a plasma nitridation treatment. Therefore, modification by an oxidation treatment becomes necessary. However, since modification by a plasma nitridation treatment and modification by a plasma oxidation treatment both are a low-temperature process, a modification effect high enough for practical use can be hardly obtained only by combining these treatments. The thermal stability is enhanced by applying a plasma nitridation treatment and based on the utilization of this property, when a thermal oxidation annealing treatment at a high substrate treatment temperature is performed in combination subsequently to the plasma nitridation treatment, a sufficiently high modification effect can be obtained.

(Modification by Thermal Annealing Treatment)

The modification method by a thermal annealing treatment is described in detail below.

FIG. 3 is a schematic cross-sectional view in the vertical direction showing one example of a thermal reaction furnace 33 usable for the thermal annealing step of the present invention.

As shown in FIG. 3, the treatment chamber 82 of the thermal reaction furnace 33 is a vacuum container formed of, for example, aluminum. Although not shown in FIG. 3, a heating mechanism or a cooling mechanism is provided in the treatment chamber 82.

As shown in FIG. 3, a gas inlet pipe 83 for introducing a gas is connected to the top center of the treatment chamber 82, and the inside of the treatment chamber 82 is communicating with the inside of the gas inlet pipe 83. Also, the gas inlet pipe 83 is connected to a gas supply source 84. A gas is supplied to the gas inlet pipe 83 from the gas supply source 84 and the gas is introduced into the treatment chamber 82 through the gas inlet pipe 83. As for this gas, oxygen, nitrogen, ammonia, rare gas or the like is used.

In the bottom of the treatment chamber 82, a pedestal 87 for placing a waver W thereon is disposed.

In this embodiment shown in FIG. 3, a wafer W is placed on the pedestal 87 by an electrostatic chuck (not shown) in a size having the same diameter with the wafer W. This pedestal 87 is fabricated to have a structure such that thermoelectric source means (not shown) is internally connected and the treating surface of a wafer W placed on the pedestal 87 can be adjusted to a predetermined temperature.

The pedestal 87 possesses a mechanism capable of rotating the wafer W as desired. It is also possible that the wafer W is heated by heating the pedestal 87 with a lamp, or the wafer W is directly heated with a lamp.

In FIG. 3, an opening 82a for taking out and putting in a wafer W is provided in the side surface of the treatment chamber 82 on the right side of the pedestal 87, and this opening 82a is opened or closed by the movement of a gate valve 98 in the vertical direction of the Figure. In FIG. 3, an arm (not shown) for transporting a wafer W is further adjoined on the right side of the gate valve 98, and the transportation arm moves in or out of the treatment chamber 82 through the opening 82a to place a wafer W on the pedestal 87 or carry out the treated wafer W from the treatment chamber 82.

Above the pedestal 87, a shower head 88 as a shower member is provided. This shower head 88 is formed to divide the space between the pedestal 87 and the gas inlet pipe 83 and is formed of, for example, aluminum.

The shower head 88 is disposed such that a gas outlet 83a of the gas inlet pipe 83 comes to the top center of the shower head, and a gas is introduced into the treatment chamber 82 through a gas supply hole 89 provided in the bottom of the shower head 88.

The modification treatment method by thermal annealing is roughly classified into two cases, that is, a case where an oxygen-containing gas is used, and a case where a nitrogen-containing gas is used.

In the case of using an oxygen-containing gas, an oxygen radical is generated and an oxidation reaction occurs. Accordingly, when the oxidation treatment of the present invention is applied to an insulating film formed by CVD using an organic metal source as the raw material, an effect of burning by oxidation an organic material (carbon atom) in the film so as to remove the organic material, which is contained in a large amount in the insulating film, and enhancing the film quality is expected. Also, a suboxide weak bond present in the film is repaired by oxidation and this is expected to bring about densification of the film structure and enhancement of the characteristic. In order to obtain these effects by the thermal oxidation annealing treatment, a thermal annealing treatment for a long time is necessary.

However, the high-k substance has a low stability in many cases, and it is deteriorated in the characteristic when subjected to a thermal annealing treatment for a long time. In this case, the factors for the deterioration in the characteristic may be as follows:

(1) The boundary of the high-k and Si (substrate) is oxidized to cause an increase in the thickness, and the EOT thereof becomes thicker.

(2) In the case of silicate, the metal and Si are phase-separated in the high-k film.

(3) $SiO_2$ is scattered from in a film and the surface is exposed.

The deterioration in the characteristic can be controlled by using the modification method of the present invention, for example, by previously performing a short-time plasma nitridation treatment to enhance the thermal stability in the long-time thermal annealing treatment, or by combining a short-time plasma oxidation treatment and a short-time thermal oxidation annealing treatment.

When a nitrogen-containing gas is used to generate nitrogen radicals by using a plasme so as to effect a nitridation treatment, nitrogen gas ($N_2$) may be used. However, it is also possible in the nitridation treatment to use ammonia gas ($NH_3$) which is relatively easily dissociable to radicals. The dielectric constant of the film increases by virtue of nitrogen atom contained in the insulating film and therefore, this treatment can be suitably applied to a gate insulating film or the like of a MOSFET. Also, the oxidation resistance of an insulating film subjected to nitridation is enhanced, so that oxidation on the interface at the annealing for activating a dopant can be suppressed and increase in the electrical film thickness can be reduced. Furthermore, when an interelectrode insulating film of a capacitor is subjected to nitridation and a metal electrode is formed thereon, oxidation of the upper metal electrode is suppressed and a problem such as separation of the electrode can be avoided. In addition, by performing nitridation, the effect of preventing boron penetration in a P-type MOSFET is enhanced, so that deterioration of characteristic in a P-type MOSFET, such as fluctuation of the threshold voltage, can be suppressed. Also, a dangling bond or the like in the film is repaired by the high-temperature process and the characteristic of the insulating film are enhanced. However, carbon contained in the film cannot be burned only by a thermal nitridation annealing treatment. Therefore, modification by an oxidation treatment becomes necessary. It is, however, difficult in view of low thermal stability of a high-k substance to perform modification by thermal nitridation annealing and modification by thermal oxidation annealing in combination. Consequently, a sufficiently high modification effect can be obtained by performing an oxidation treatment by plasma oxidation at a low substrate treatment temperature in combination with the thermal nitridation treatment.

As for the thermal annealing temperature in the present invention, a temperature range preferably from 500 to 1,200° C., more preferably from 600 to 1,050° C., may be suitably used.

The present invention is described in greater detail below by referring to Examples.

EXAMPLES

Figure 4:
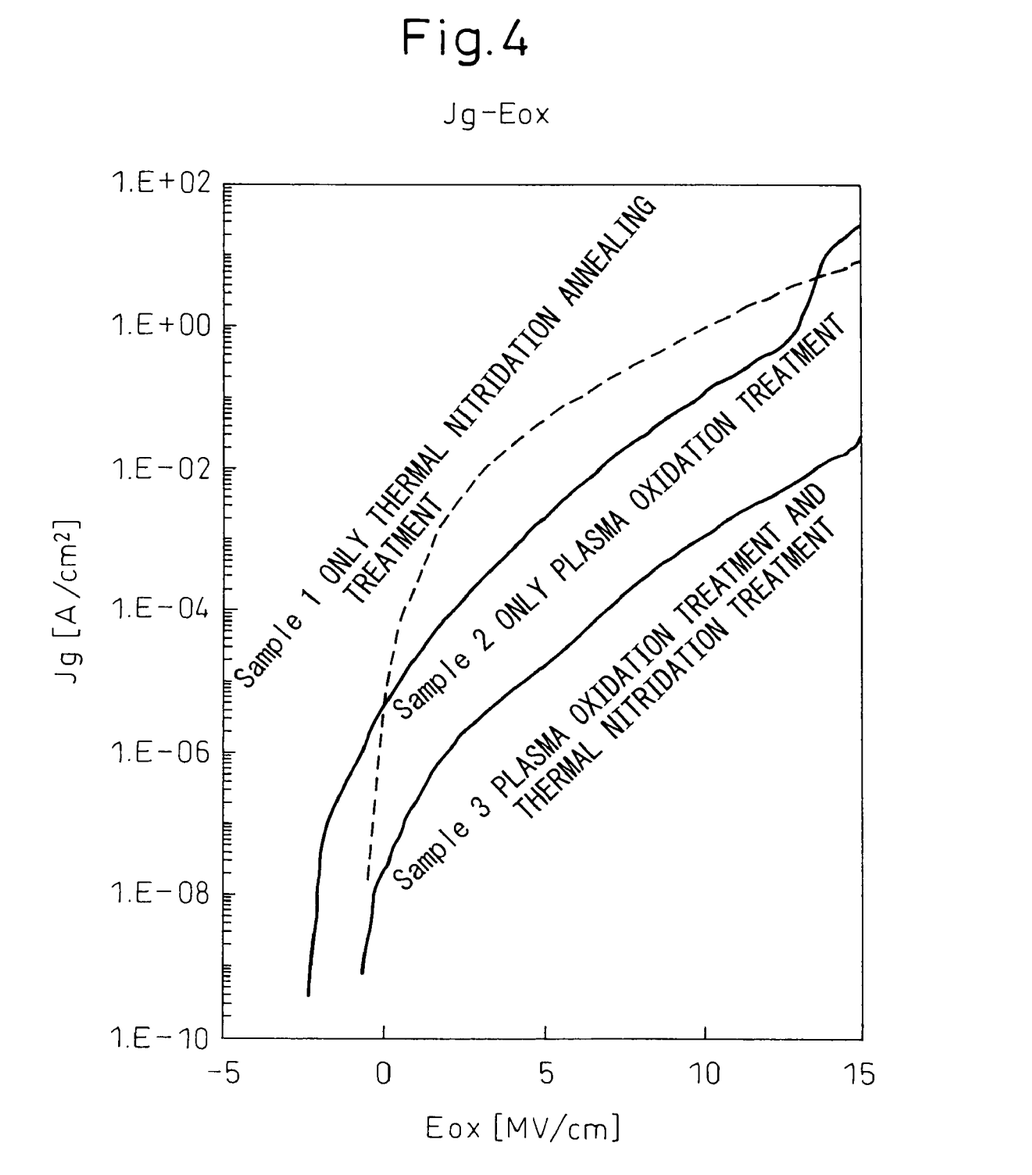
FIG. 4 shows I-V characteristics of an HfSiO film modified by using the present invention.

FIG. 4 shows I-V characteristics of an HfSiO film modified by using the present invention, which is one example of the present invention. In FIG. 4, the ordinate indicates a gate leakage current density of an N-type MOS capacitor comprising a P-type silicon substrate, an HfSiO film and a TiN (titanium nitride) gate electrode, and the abscissa indicates an electric field applied to the insulating film from a polysilicon gate electrode. The production method of the N-type MOS capacitor used in this Example is described below.

An HfSiO film was formed by a thermal CVD method on a P-type silicon substrate subjected to the same treatments as in FIGS. 1A and 1B. A hafnium tert-butoxide (HTB, $Hf(OC_4H_9)_4$) and a silane gas ($SiH_4$) were introduced at 1 sccm and 400 sccm, respectively, and the pressure was kept at 50 Pa. The flow rate of HTB is a flow rate on a liquid mass-flow controller and the flow rate of the silane gas is a flow rate on a gas mass-flow controller. In this atmosphere, the silicon substrate shown in FIG. 1B was heated at 350° C. and the reaction species Hf, Si and O were reacted on the substrate to form an HfSiO film. By controlling the process conditions including the treatment time, an HfSiO film of 4 nm was formed. This HfSiO film was further modified as follows by using an oxygen plasma and thermal nitridation annealing.
(SPA Oxidation Treatment)

After heating the substrate at 400° C., a rare gas and oxygen were supplied to flow on the wafer at 2,000 sccm and 150 sccm, respectively, and the pressure was kept at 130 Pa. In this atmosphere, microwave of 3 W/cm² was irradiated through a plane antenna having a plurality of slots for 10 seconds to form a plasma containing oxygen and a rare gas. Using this plasma, an oxidation plasma treatment of the HfSiO film was performed to form a strong Si—O bond by repairing a weak bond or burn and remove carbon in the film.
Preferable Condition of Oxidation Plasma Treatment On the silicon substrate subjected to the above "high-k gate insulating film-forming" treatment, a SPA plasma oxidation treatment is performed. On the silicon substrate heated from a room temperature to 700° C., a rare gas and oxygen were supplied to flow at 500 to 3,000 sccm and 5 to 500 sccm, respectively, and the pressure was kept at 7 Pa to 270 Pa (50 m Torr to 2,000 m Torr). In this atmosphere, microwave of 2 to 3 W/cm² was irradiated through a plane antenna having a plurality of slots to form a plasma containing oxygen and a rare gas. Using this plasma, a plasma oxidation treatment is performed on the substrate after the treatment of the "high-k gate insulating film-forming" (FIG. 1D).
(Thermal Annealing Treatment)

Subsequently, thermal nitridation annealing was performed so as to attain more structural relaxation and increase the dielectric constant by virtue of nitrogen introduced. In the thermal nitridation annealing treatment, a substrate was transferred into the heat treatment unit schematically shown in FIG. 3, and the substrate was heated at 1,000° C. in a nitrogen gas atmosphere and then left standing for 15 seconds.
Preferable Condition of Thermal Nitridation Annealing Treatment A thermal annealing treatment was performed by heating a silicon substrate under an atmospheric pressure at 600° C. to 1,050° C. in the atmosphere that $N_2$ gas was introduced at 1,000 to 4,000 sccm, which is kept for 10 seconds to 1 minute.

By applying such a process, a gate insulting film having good characteristic with an electrical film thickness of about 2 nm was finally formed. Subsequently, TiN working out to a gate electrode was film-formed in the step shown in FIG. 1E and by passing through the patterning and etching step shown in FIG. 1F, an MOS capacitor structure of FIG. 1F was produced.

As shown in FIG. 4, Sample 1 which is a sample treated only by a thermal nitridation annealing treatment and Sample 2 which is a sample treated only by a plasma oxidation treatment each shows a high leakage current value, whereas in Sample 3 which is a sample subjected to a plasma oxidation treatment and then to a thermal nitridation annealing treatment, the leakage current is decreased. As seen from this, when the modification of an insulating film of the present invention is performed, a modification effect more effective than that obtained by a conventional modification method, namely, modification by a thermal annealing treatment or modification by a plasma treatment, can be successfully obtained.

Figure 5:
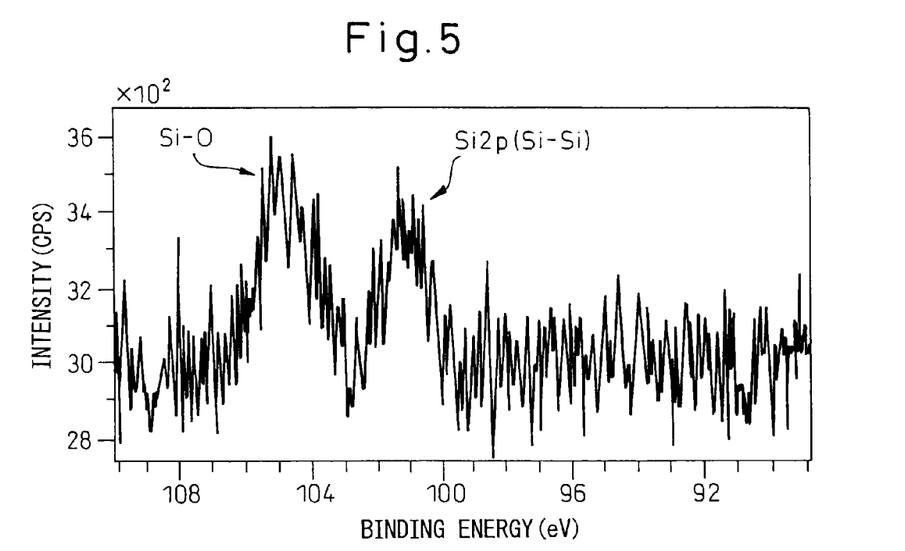
FIG. 5 is a graph showing an example of the results of XPS analysis of an HfSiO film, which has not been subjected to plasma processing.
Figure 6:
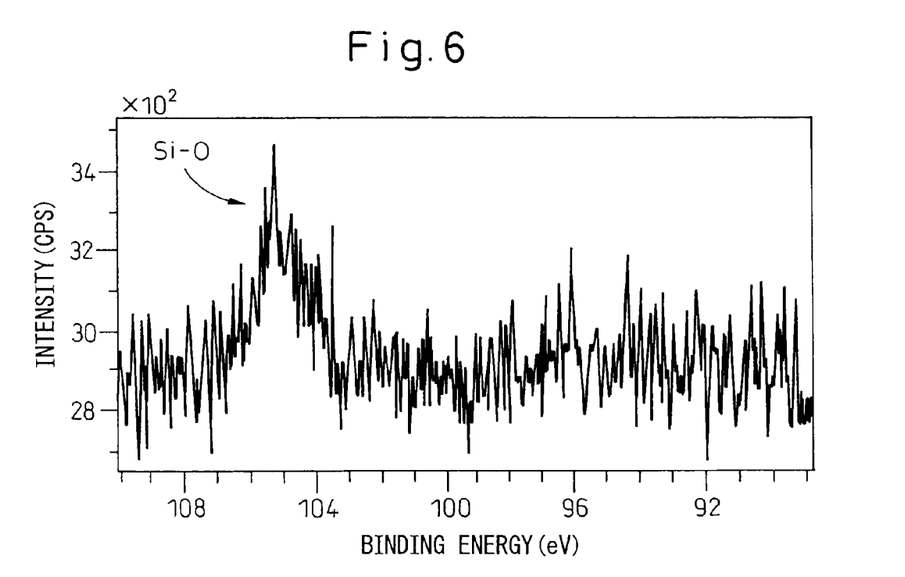
FIG. 6 is a graph showing an example of the results of XPS analysis of an HfSiO film, which has been subjected to plasma processing.

Next, the characteristic of the HfSiO films was assessed in the case that the oxidation plasma treatment was not performed on the HfSiO film and in the case that the oxidation plasma treatment was performed on the HfSiO film. FIG. 5 is a graph showing an example of a result of XPS analysis of the HfSiO film without the plasma treatment. FIG. 6 is a graph showing an example of a result of XPS (X-ray photoelection spectroscopy) analysis of the HfSiO film with the plasma treatment. In these graphs, the horizontal scale represents binding energy and the vertical scale represents spectrum intensity.

Formation of the assessed samples will be explained. A P-type silicon substrate having a specific resistance of 1 to 100Ω and plain orientation (100) was used for a substrate. The silicon substrate was subjected to DHF cleaning to remove a natural oxide film on the silicon substrate.

Next, tantalum oxide ($Ta_2O_5$) was film-formed on the silicon substrate by the CVD method. As a Ta source, tantalum pentaethoxide (PET: Ta $(C_2H_5O)_5$) was used. In this case, an object of film-forming $Ta_2O_5$ on the silicon substrate is to block a signal from the Si substrate at the time of XPS analysis to correctly measure the Si bond in the film.

Then, on the $Ta_2O_5$ film, hafnium silicate (HfiO) was film-formed by CVD. The film was formed using the same material and under the same condition as mentioned above. The film thickness of HfiO was 4 nm.

Next, SPA plasma oxidation was performed on the silicon substrate. After heating the silicon substrate at 400° C., a rare gas and oxygen were supplied to flow on the silicon substrate at 500 to 3,000 sccm and 5 to 500 sccm, respectively, and the pressure was kept at 7 Pa to 270 Pa (50 m Torr to 2,000 m Torr). In this atmosphere, microwave of 2 to 3 W/cm$^2$ was irradiated through a plane antenna having a plurality of slots to form a plasma containing oxygen and a rare gas. Using this plasma, a plasma oxidation treatment was performed on the substrate described in above 3.

The wafer was cut into a silicon chip of 5×5 mm square and used as a sample. The XPS characteristic was assessed using an ESCA 3400 from "Shimazu Seisakusho".

FIG. 5 shows the XPS signal of the HfSO film without the plasma oxidation treatment. The peak around 101 eV shows a Si—Si bond and the peak around 105 eV shows a Si—O bond. From FIG. 5, it has been observed that in the HfSiO film, a Si—Si bond and a Si—O bond coexist. The contribution of the signal from the Si substrate was removed from the Si—Si signal observed herein by the grounding $Ta_2O_5$ film.

It is considered that the chemical stability of the HfSiO film can be increased when a lot of $SiO_2$ is included in the film. Extremely, the $SiO_2$ film has a very excellent thermal stability, and the HfSiO film has a very low thermal stability. Also, a Si—Si bond becomes a strong diamond bond when it is crystallized, but it forms a weak bond when it is contained in an amorphous substance. Accordingly, a film containing many Si—Si bonds may have many defects and may cause deterioration in electrical characteristic. Also, because there are a lot of weak bonds, the thermal stability is weak. Accordingly, when it is applied to a practical device, the HfSiO film may be crystallized in the thermal treatment in the later step, and may form a grain boundary to thereby extremely deteriorate the device characteristic.

FIG. 6 shows the XPS signal of the HfSiO film with the plasma oxidation treatment. The Si—Si bond around 101 eV, which was strongly observed when the plasma oxidation was not performed, is not observed in FIG. 5. It was observed that the Si—O bond is dominant. Accordingly, by performing the plasma oxidation treatment, the Si—Si bond, which may cause generation of a defect in the film and lowering of the thermal stability, decreases, and the Si—O bond which has few defects and increases thermal stability, increases. Thus, it is deemed that the film characteristic has been improved.

In this Example, HfSiO is used as the insulating film, but it is considered that the same effect can be realized by applying a similar plasma oxidation treatment or plasma nitridation treatment to an insulating film other than HfSiO.

Furthermore, in this Example, a plasma oxidation treatment and a thermal nitridation annealing treatment are used as the modification treatment, but a plasma treatment or a thermal annealing treatment other than these may also be arbitrarily combined.

Those skilled in the art will appreciate that all or part of systems and methods consistent with the present invention may be stored on or read from other computer-readable media, such as secondary storage devices, like hard disks, floppy disks, and CD-ROM; a carrier wave received from the Internet; or other forms of computer-readable memory, such as read-only memory (ROM) or random-access memory (RAM).

One skilled in the art will appreciate that a system suitable for use with the exemplary embodiments may be implemented with additional or different components (such as multiple processors, routers or subnetworks, multiple computers or computing devices in communication with each other) and a variety of input/output devices and program modules (such as interactive TV set-top receivers with EEPROM memories containing their operating instructions).

INDUSTRIAL APPLICABILITY

As described hereinabove, the present invention provides a method of modifying an insulting film, which is capable of imparting good insulating characteristic to an insulating film, by subjecting the insulating film to a modification treatment comprising a combination of plasma treatment and thermal annealing treatment.

The invention claimed is:

1. A substrate processing method comprising:
disposing in a processing container a substrate on which is a vapor deposited insulating film,
introducing a gas containing oxygen atom and a rare gas into the processing container and introducing electromagnetic wave into the processing container through an antenna to generate a plasma, thereby subjecting the vapor deposited insulating film to a plasma oxidation treatment by the plasma,
subjecting the plasma oxidized insulating film to a thermal nitridation annealing treatment at a temperature of 500 to 1,200° C.

2. The substrate processing method according to claim 1, wherein the antenna comprises a plane antenna and microwave is introduced into the plane antenna to generate the plasma.

3. The substrate processing method according to claim 1, wherein the gas to be used for the thermal nitridation annealing contains any of nitrogen ($N_2$) and ammonia ($NH_3$).

4. The substrate processing method according to claim 1, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

5. A substrate processing method comprising:
   disposing in a processing container a substrate on which is a vapor deposited insulating film,
   introducing a gas containing nitrogen atom and a rare gas into the processing container and introducing electromagnetic wave into the processing container through an antenna to generate a plasma, thereby subjecting the vapor deposited insulating film to a plasma nitridation treatment by the plasma,
   subjecting the plasma nitrided insulating film to a thermal oxidation annealing treatment at a temperature of 500 to 1,200° C.

6. The substrate processing method according to claim 5, wherein the antenna comprises a plane antenna and microwave is introduced into the plane antenna to generate the plasma.

7. The substrate processing method according to claim 5, wherein the gas to be used for the thermal oxidation annealing contains any of oxygen ($O_2$) and ozone ($O_3$).

8. The substrate processing method according to claim 5, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

9. A substrate processing method comprising:
   disposing in a processing container a substrate on which is a vapor deposited insulating film,
   subjecting the vapor deposited insulating film to a thermal oxidation annealing treatment at a temperature of 500 to 1,200° C.,
   introducing a gas containing nitrogen atom and a rare gas into the processing container and introducing electromagnetic wave into the processing container through an antenna to generate a plasma, thereby subjecting the thermal oxidation annealed insulating film to a plasma nitridation treatment by the plasma.

10. The substrate processing method according to claim 9, wherein the antenna comprises a plane antenna and microwave is introduced into the plane antenna to generate the plasma.

11. The substrate processing method according to claim 9, wherein the gas to be used for the thermal oxidation annealing contains any of oxygen ($O_2$) and ozone ($O_3$).

12. The substrate processing method according to claim 9, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

13. A substrate processing method comprising:
   disposing in a processing container a substrate on which is a vapor deposited insulating film,
   subjecting the vapor deposited insulating film to a thermal nitridation annealing treatment at a temperature of 500 to 1,200° C.,
   introducing a gas containing oxygen atom and a rare gas into the processing container and introducing electromagnetic wave into the processing container through an antenna to generate a plasma, thereby subjecting the thermal nitridation annealed insulating film to a plasma oxidation treatment by the plasma.

14. The substrate processing method according to claim 13, wherein the antenna comprises a plane antenna and microwave is introduced into the plane antenna to generate the plasma.

15. The substrate processing method according to claim 13, wherein the gas to be used for the thermal nitridation annealing contains any of nitrogen ($N_2$) and ammonia ($NH_3$).

16. The substrate processing method according to claim 13, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

17. A substrate processing method comprising:
   disposing in a processing container a substrate on which is a vapor deposited insulating film,
   introducing a gas containing nitrogen atom and a rare gas into the processing container and introducing electromagnetic wave into the processing container through an antenna to generate a plasma, thereby subjecting the vapor deposited insulating film to a plasma nitridation treatment by the plasma,
   subjecting the plasma nitrided insulating film to a thermal nitridation annealing treatment at a temperature of 500 to 1,200° C., or introducing a gas containing oxygen atom and a rare gas into the processing container and introducing electromagnetic wave into the processing container through an antenna to generate a plasma, thereby subjecting the plasma nitrided insulating film to a plasma oxidation treatment by the plasma,
   introducing a gas containing oxygen atom and a rare gas into the processing container and introducing electromagnetic wave into the processing container through an antenna to generate a plasma, thereby subjecting the thermal nitridation annealed insulating film to a plasma oxidation treatment by the plasma or subjecting the plasma oxidized insulating film to a thermal nitridation annealing treatment at a temperature of 500 to 1,200° C.

18. The substrate processing method according to claim 17, wherein the antenna comprises a plane antenna and microwave is introduced into the plane antenna to generate the plasma.

19. The substrate processing method according to claim 17, wherein the gas to be used for the thermal nitridation annealing contains any of nitrogen ($N_2$) and ammonia ($NH_3$).

20. The substrate processing method according to claim 17, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

21. A substrate processing method according to claim 9, further comprising:
   introducing a gas containing oxygen atom and a rare gas into the processing container and introducing electromagnetic wave into the processing container through an antenna to generate a plasma, thereby subjecting the plasma nitrided insulating film to a plasma oxidation treatment by the plasma.

22. The substrate processing method according to claim 21, wherein the antenna comprises a plane antenna and microwave is introduced into the plane antenna to generate the plasma.

23. The substrate processing method according to claim 21, wherein the gas to be used for the thermal oxidation annealing contains any of oxygen ($O_2$) and ozone ($O_3$).

24. The substrate processing method according to claim 21, wherein the vapor deposited insulating film is selected from a low-dielectric material of $SiO_2$, SiON or $Si_3N_4$, and a high-dielectric material of $Ta_2O_5$, $Al_2O_3$, $La_2O_3$, $TiO_2$, $Y_2O_3$.BST, $Pr_2O_3$, $Gd_2O_3$, $CeO_2$, $HfO_2$, HfSiO, or $ZrO_2$.

* * * * *